(12) United States Patent
Lee et al.

(10) Patent No.: US 8,803,186 B2
(45) Date of Patent: Aug. 12, 2014

(54) LED SUBSTRATE STRUCTURE, LED UNIT AND LIGHTING MODULE HAVING THE SAME

(75) Inventors: Hou-Te Lee, Kaohsiung (TW); Tsung-Kang Ying, New Taipei (TW); Chia-Hung Chu, Miaoli County (TW); Shih-Po Yu, New Taipei (TW)

(73) Assignees: Lite-On Electronics (Guangzhou) Limited, Guangzhou (CN); Lite-On Technology Corporation, Taipei (TW)

( * ) Notice: Subject to any disclaimer, the term of this patent is extended or adjusted under 35 U.S.C. 154(b) by 0 days.

(21) Appl. No.: 13/545,643

(22) Filed: Jul. 10, 2012

(65) Prior Publication Data

US 2013/0134471 A1    May 30, 2013

(30) Foreign Application Priority Data

Nov. 30, 2011    (CN) .......................... 2011 1 0388101

(51) Int. Cl.
*H01L 33/62* (2010.01)
*H01L 33/48* (2010.01)

(52) U.S. Cl.
CPC .............. *H01L 33/62* (2013.01); *H01L 33/486* (2013.01); *H01L 2224/48091* (2013.01)
USPC ................. 257/99; 257/91; 257/98; 257/100; 257/E33.066; 438/22; 438/26; 438/27

(58) Field of Classification Search
CPC ....... H01L 33/62; H01L 33/486; H01L 33/32; H01L 33/54; H01L 33/58; H01L 25/0753; H01L 33/56; H01L 21/0262; H01L 2224/48091; H01L 2224/48227; B82Y 20/00
USPC ........ 257/91, 98, 99, 100, E33.066, E33.059; 438/22, 26, 27
See application file for complete search history.

(56) References Cited

U.S. PATENT DOCUMENTS

| | | | |
|---|---|---|---|
| 6,093,940 A * | 7/2000 | Ishinaga et al. ................. | 257/99 |
| 7,183,588 B2 * | 2/2007 | Chia et al. ....................... | 257/99 |
| 8,367,945 B2 * | 2/2013 | Cheng et al. ................... | 174/536 |
| 2011/0186868 A1 * | 8/2011 | Watari et al. .................... | 257/88 |
| 2011/0186900 A1 * | 8/2011 | Watari et al. .................... | 257/99 |
| 2012/0061703 A1 * | 3/2012 | Kobayashi ...................... | 257/98 |

* cited by examiner

*Primary Examiner* — Thinh T Nguyen
(74) *Attorney, Agent, or Firm* — Li & Cai Intellectual Property (USA) Office

(57) ABSTRACT

An LED substrate structure has a substrate and a conducting portion. The substrate has a bottom surface and two opposite first lateral surfaces connected with the bottom surface. The bottom surface has the conducting portion formed thereon, and the conducting portion has a first cutting segment located on a contact border defined between one of the two first lateral surfaces and the bottom surface. The conducting portion further has an expansion region connected with the first cutting segment. The length of the first cutting segment is shorter than any segment taken on the expansion region parallel thereto.

20 Claims, 11 Drawing Sheets

LED SUBSTRATE STRUCTURE, LED UNIT AND LIGHTING MODULE HAVING THE SAME

BACKGROUND OF THE INVENTION

1. Field of the Invention

The present invention relates to a substrate structure, a light emitting device (LED) unit having such substrate structure, and a light source module utilizing such LED unit. Particularly, the present invention relates to a LED substrate structure, a LED unit and a lighting module having the same.

2. Description of Related Art

LEDs can be disposed on a printed circuit board (PCB) through surface-mount technique (SMT) as a surface-mount device. Depending on the illumination style/arrangement of the LED die, the surface mounted LEDs can be further classified into a side-view type and a top-view type.

In the conventional LED unit assembling process, at least one LED die is mounted on a substrate and then encapsulated by a packaging material to form a LED unit. In the side-view type LED unit, the LED unit is mounted side-way on the PCB in such a way that a lateral surface adjacent to a rear metal portion of the LED unit may establish contact with a mounting surface of the PCB, so that the rear metal portion is arranged adjacent to a solder pad on the PCB. Particularly for this arrangement, soldering material is deposited at the junction where the rear metal portion meets the solder pad of the PCB (hereinafter referred to as "contact border"). The melted soldering material would vertically "climb onto" the real metal portion, thus fixing the LED unit side-way on the PCB. To enhance the fixing effect of the LED unit on the PCB, i.e. soldering ability, the rear metal portion of a conventional side-view type LED unit often takes a triangular or cuplike shape, where the width of the metal portion is greatest proximate the contact border and narrowest toward the center portion thereof. As the singulation process for each individual LED unit is carried out, burrs on the metal portion along the cutting line often occur as a result. The burr along the edge of the metal portion (where the width thereof is the widest) creates a long and unsmooth segment that makes it difficult for soldering. In other words, the burrs formed on the metal portion of the LED unit along the cutting path may reduce the soldering material's adhesion ability. Particularly, under common low temperature soldering process conditions in which soldering material still retain high viscosity and thus exhibits poor flowability/wettability, poor soldering may occur more often. As a result, production yield would be negatively affected.

On the other hand, the LED die is fixed on a die-bonding area of the substrate through the coverage of the packaging material. However, the packaging material is often made of plastics while the die-bonding area is made of metal. Due to the difference in material characteristics between the plastic packaging material and the metallic die-bonding area of the substrate, the contact interface therebetween may exhibit inadequate bonding strength. As a result, the packaging material may spill out through the interface or the soldering material may undesirably permeate into the LED packaging material. In addition, moisture from the surrounding environment may enter into the LED through the plastic-metal boding interface to contaminate the LED die. As a result, the reliability and the stability of the traditional LED unit suffer.

SUMMARY OF THE INVENTION

One object of the instant disclosure is providing a LED substrate structure, a LED unit that utilizes the LED substrate structure, and a lighting module incorporating the LED unit. The LED substrate structure has an improved conducting portion capable of reducing the length of a cutting segment where burr may be formed. Further, the conducting portion has oblique sides to facilitate a soldering material climbing from a carrier board. Thus, the fixing strength between the LED substrate structure and the carrier board is improved.

By reducing the length of the first cutting segment, the problem of the climbing resistance resulted from the burr of the first cutting segment may be solved. On the other hand, an expansion region adjacent to the first cutting segment is formed as a sector-like area so that the soldering material may climb upon the conducting portion more easily and efficiently.

For further understanding of the instant disclosure, reference is made to the following detailed description illustrating the embodiments and examples of the instant disclosure. The description is for illustrative purpose only and is not intended to limit the scope of the claim.

DETAILED DESCRIPTION OF THE PREFERRED EMBODIMENTS

Figure 1A:
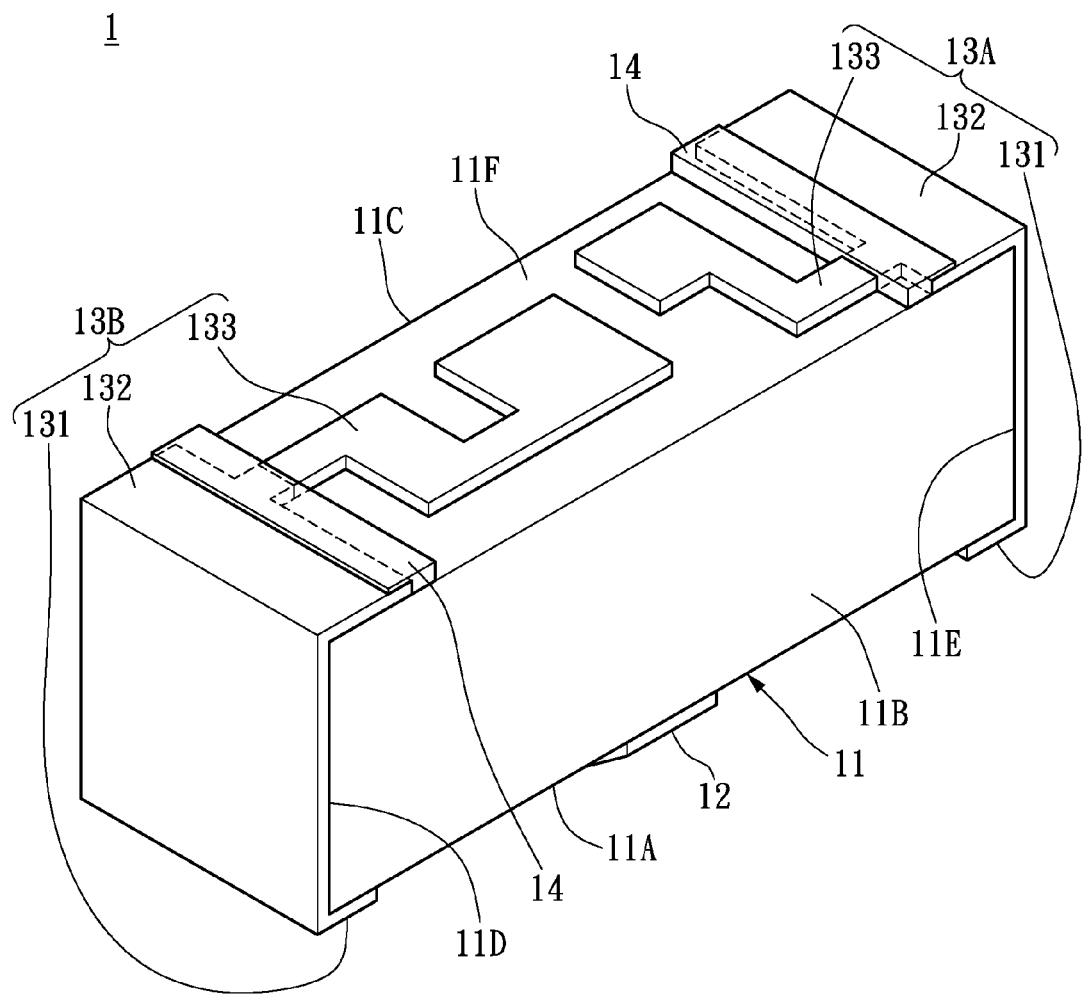
FIG. 1A shows a perspective top-view of the LED substrate structure of the instant disclosure.

The embodiment of the instant disclosure will now be described hereinafter and identical or similar elements in the various figures are designated with the same reference numerals.

Figure 1B:
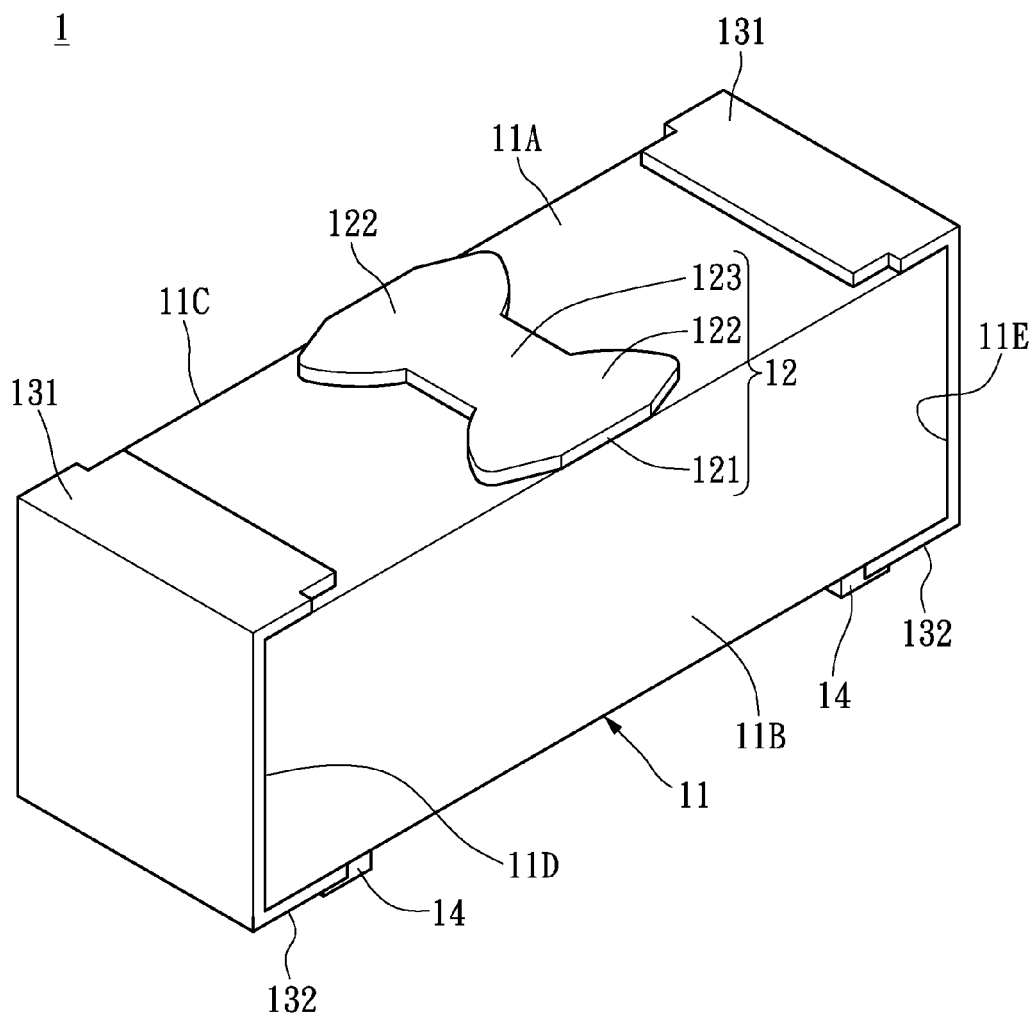
FIG. 1B shows a perspective bottom-view of the LED substrate structure of the instant disclosure.

Please refer to FIGS. 1A and 1B, which shows a top isometric view and a bottom isometric view of an exemplary LED substrate structure in accordance with the instant disclosure. The instant disclosure provides a LED substrate structure 1 which comprises a substrate 11 having a conducting portion 12 formed thereon. The conducting portion 12 has an expansion region 122 with modified width variation so that the soldering materials may more easily climb up on the expansion region 122, thus achieving better connection strength with a carrier board after soldering.

Figure 2:
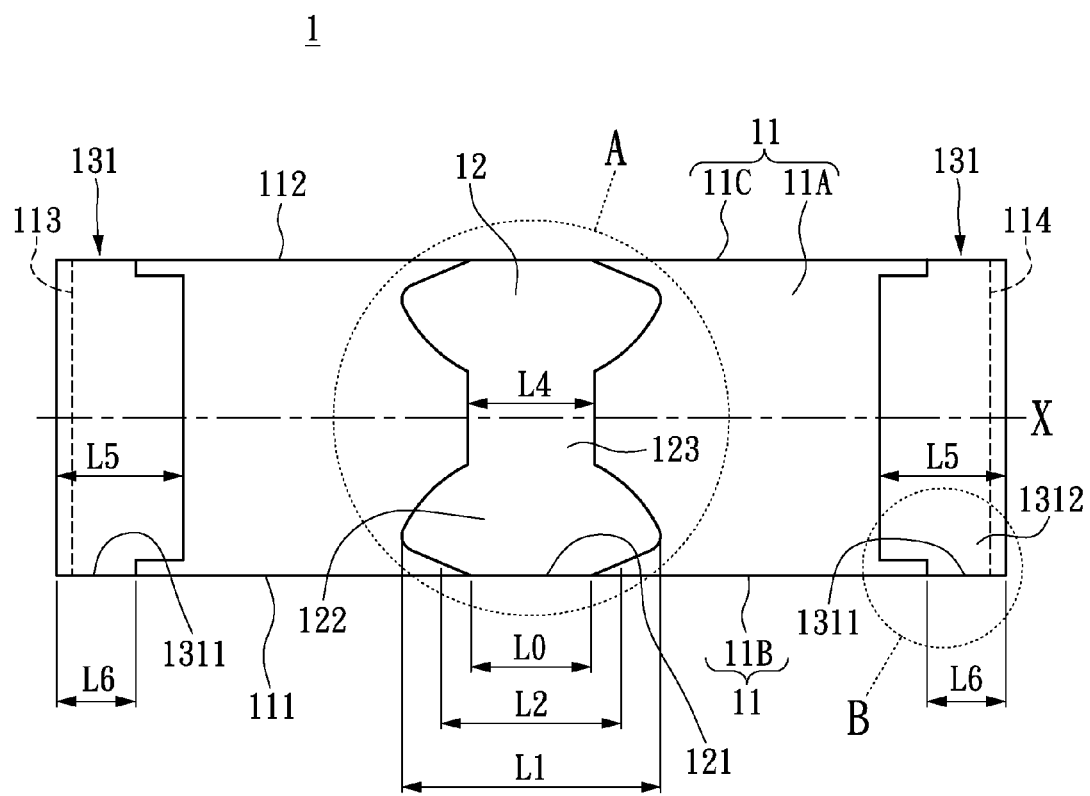
FIG. 2 shows a bottom view of the LED substrate structure of the instant disclosure.

Please refer to FIG. 2, which shows an overhead view of the bottom surface of a LED substrate structure 1 in accordance with the instant disclosure. The substrate 11 is preferably a rectangular parallelepiped upon dicing/sawing from a substrate array, but the exact shape thereof is not restricted to the specific embodiment provided herein. The exemplary substrate 11 has a substantially rectangular bottom surface 11A and two opposite first lateral surfaces 11B, 11C immediately connecting the bottom surface 11A. Specifically, the bottom surface 11A has two pairs of respectively opposing sides 111~114, wherein the two opposite first lateral surfaces 11B, 11C are in respective connection with the pair of opposite first sides 111, 112 of the bottom surface 11A (hereinafter referred to as the long sides). The substrate 11 further has a pair of opposite second lateral surfaces 11D, 11E respectively in connection with the two second sides 113, 114 (hereinafter referred to as the short sides) of the bottom surface 11A, and a mounting surface 11F (e.g., the top surface) opposite to the bottom surface 11A. The conducting portion 12 is exposedly arranged on the bottom surface 11A, and the quantity of the conducting portion 12 may be one or more based on the specific type of LED unit we wish to obtain, such as a single-chip LED unit, a two-chip LED unit, or a three-chip LED unit.

Figure 3A:
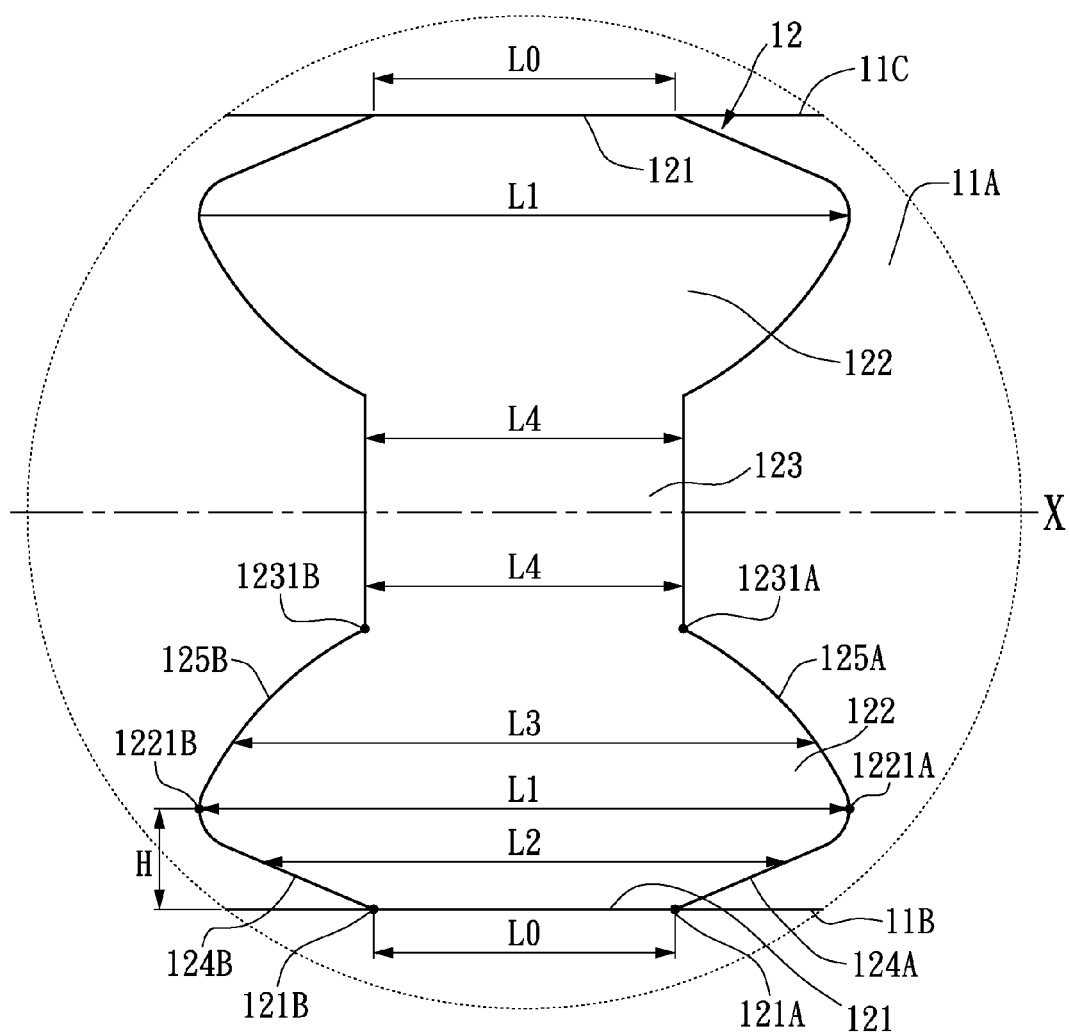
FIG. 3A is an enlarged view of "A" part in FIG. 2.

The conducting portion 12 traverses across the width of the rectangular bottom surface 11A. Specifically, the conducting portion 12 is arranged/patterned on the bottom surface 11A, extending from one of the long sides 111/112 (such as the first side 111) at a contact border defined by the first lateral surface 11B and the bottom surface 11A, to the other long side (such as the opposing first side 112) at the contact border defined by the bottom surface 11A and the first lateral surface 11C. The conducting portion 12 has at least one expansion region 122 and a main region 123 connected to the expansion region 122. In the instant exemplary embodiment, the main region 123 is located between two expansion regions 122, giving the conducting portion 12 a shape that resembles a dumbbell when viewed from above. Specifically, as shown in the instant exemplary embodiment, the main region 123 of the conductive portion 12 is generally rectangular, while the expansion region 122 thereof widens perpendicularly with respect to the transverse traversing direction of the conductive portion 12 (i.e. parallel to the long side 111 between the first lateral surface 11B and the bottom surface 11A) with width variation. After singulation process is carried out, a first cutting segment 121 is generated as a result on the extremity of the conducting portion 12 proximate the long side 111 at the contact border defined by the first lateral surface 11B and the bottom surface 11A. Please refer to FIG. 3A. For the ease of illustration, the width of the conducting portion 12 at different sections thereof are respectively labeled with a corresponding segment length (for example, L0, L1, etc.). Preferably, the first conducting portion 121 (having a width L0) is of substantially identical width as the main region 123 (having a width L4), and preferably, the length (width) of the expansion region 122 is no smaller than that of the main region 123. Specifically, a segment on the expansion region 122 parallel to the first cutting segment 121 has a longest length (i.e., L1) that is greater than any length (width) of a parallel segment (i.e., L4) taken on the main region 123. Furthermore, the conducting portion 12 extends obliquely outward from the two end points 121A/121B of the first cutting segment 121 respectively and widens toward the two end points 1221A, 1221B of the expansion region 122. The segment between the two end points 1221A and 1221B defines the abovementioned longest length L1. A first side edge 124A of the expansion region 122 is defined to be the segment between the end points 121A and 1221A, and a second side edge 124B of the expansion region 122 is defined to be the segment between the end points 121B and 1221B. Accordingly, any parallel segment taken on the expansion region 122 with respect to the first cutting segment 121 has a length (i.e., L1, L2 or L3) larger than the length of the first cutting segment 121 (i.e., L0).

From the widest segment (i.e. L1) defined between end points 1221A and 1221B, the conducting portion 123 obliquely narrows from the two end points 1221A, 1221B respectively toward the end points 1231A/1231B of the main region 123. Specifically, a third side edge 125A of the expansion region 122 is defined to be the segment between the end points 1221A and 1231A, and a fourth side edge 125B of the expansion region 122 is a segment formed by connecting the end points 1221B and 1231B. Thus, the segment defined on the expansion region 122 parallel to the first cutting segment 121 has the longest length (i.e., L1), which is greater than the length of any segment defined on the main region 123 (e.g. L4) parallel thereto.

Figure 4:
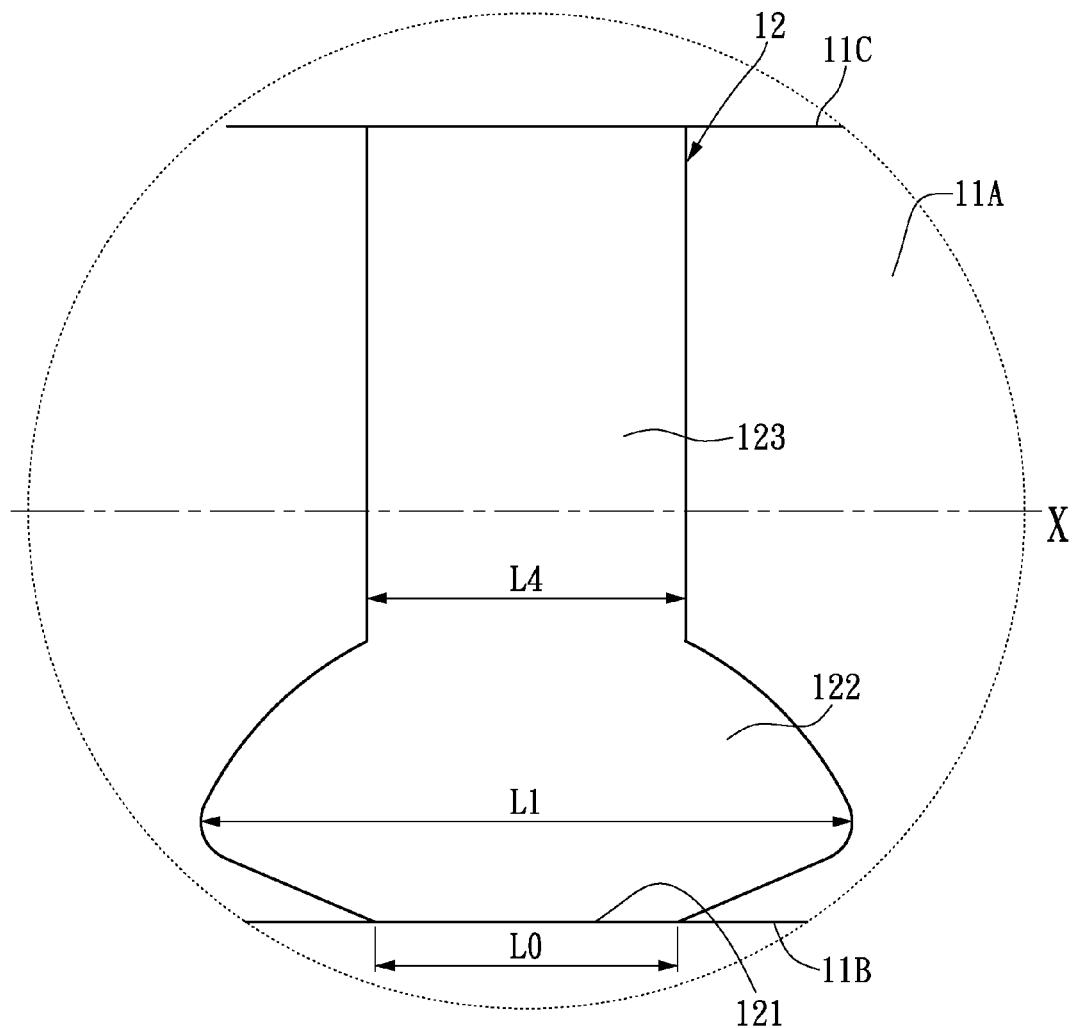
FIG. 4 shows a conducting portion of the LED substrate structure according to another embodiment of the instant disclosure.

In the instant exemplary embodiment, the conducting portion 12 has a structural arrangement that substantially symmetrically mirrors itself along the longitudinal/long axis X. That is, the conducting portion 12 has a second expansion portion 122 oppositely defined thereon, extending from the contact border defined between the bottom surface 11A and the first lateral surface 11C toward the center portion thereof, and having a similar width variation pattern as described above. In other words, the conducting portion 12 is symmetric about the longitudinal axis "X" of the LED substrate structure 1. Nevertheless, the symmetrical design is preferred but not required. In an alternative embodiment as shown in FIG. 4, the conducting portion 12 may be asymmetrically arranged about the central long axis "X." In this embodiment, the conducting portion 12 has a single expansion region 122 proximate the first lateral surface 11B, while the main region 123 extends from the expansion region 122 toward the first lateral surface 11C. Similarly, a segment defined on the expansion region 122 parallel to the first cutting segment 121 has a length (i.e., L1) greater than the length of a segment (i.e., L4) defined on the main region 123 parallel to the first cutting segment 121.

Figure 5:
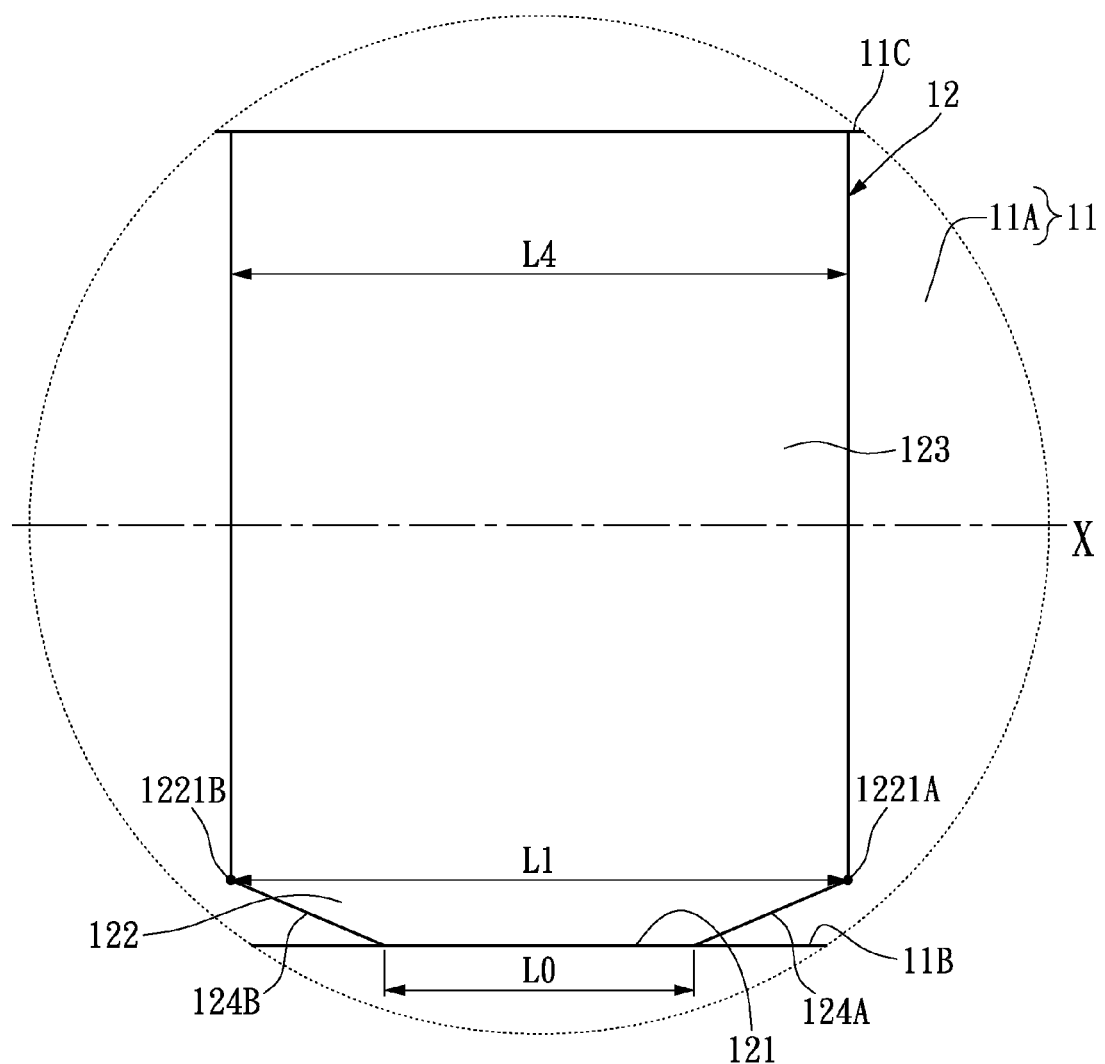
FIG. 5 shows a conducting portion of the LED substrate structure according to still another embodiment of the instant disclosure.

FIG. 5 shows a conducting portion 12 of yet another embodiment. The expansion region 122 is reduced and the main region 123 is formed from the two ends 1221A, 1221B to the long side 112 between 11A and 11C. Accordingly, a segment formed on the expansion region 122 parallel to the first cutting segment 121 has a longest length i.e., L1 equal to a length (i.e., L4) of anyone segment formed on the main region 123 parallel to the first cutting segment 121.

As previously mentioned, each individual LED unit is diced from a single substrate. During singulation process, as the dicing saw cuts through the substrate 11 and the metal traces that later forms the conducting portion 12 (e.g. Cu traces), burrs would inevitably be generated along the first cutting segment 121 on the cutting path of the dicing saw. Due to the surface irregularity and un-smoothness of the burrs at the contact border defined by the bottom surface 11A and the first lateral surface 11B/11C, the burrs along the first cutting segment 121 of the conducting portion 12 would result in poor soldering when the LED substrate structure 1 is side-mounted onto a PCB. By shortening the width of the first cutting segment 121, the present disclosure seeks to minimize the adverse effect of burrs on the soldering ability. Furthermore, because the first and the second obliquely extending side edges 124A and 124B of the expansion region 122 are not on the cutting path during singulation process, they remain smooth and "burr-free" for the soldering material to adhere to and "climb up" onto the conducting portion 12 of the LED substrate structure 1. In one embodiment, it is preferable for the expansion region 122 of the conducting portion 12 to assume the shape of a circular sector, with the arc of the sector arranged toward the contact border where the LED substrate structure 1 meets the PCB to reduce the burr size from the first cutting segment 121, thus allowing better "climbing" of the soldering material. Accordingly, as the burr size from the first cutting segment 121 is reduced, soldering materials may more effectively climb upon the entire area of the expansion region 122.

Figure 6:
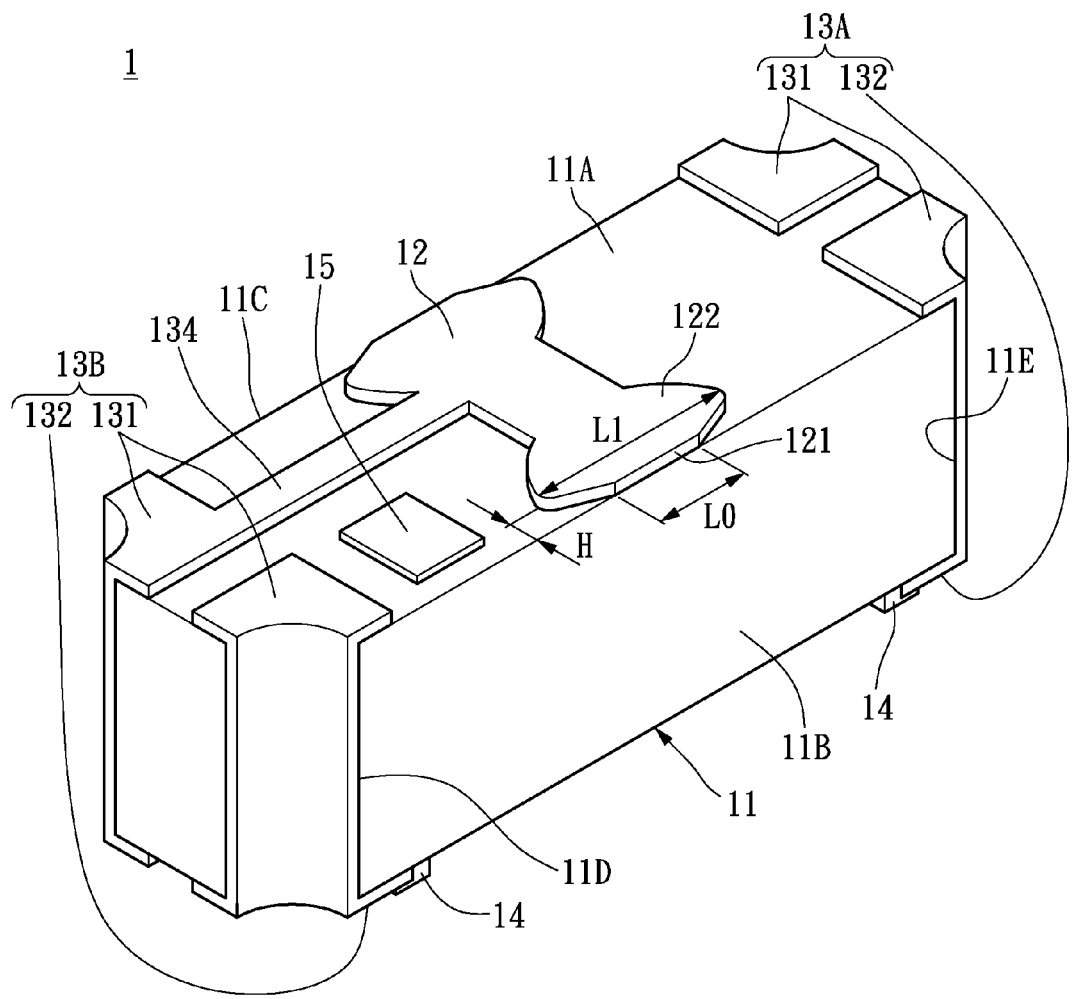
FIG. 6 shows a two-chip LED unit having the LED substrate structure of the instant disclosure.
Figure 7:
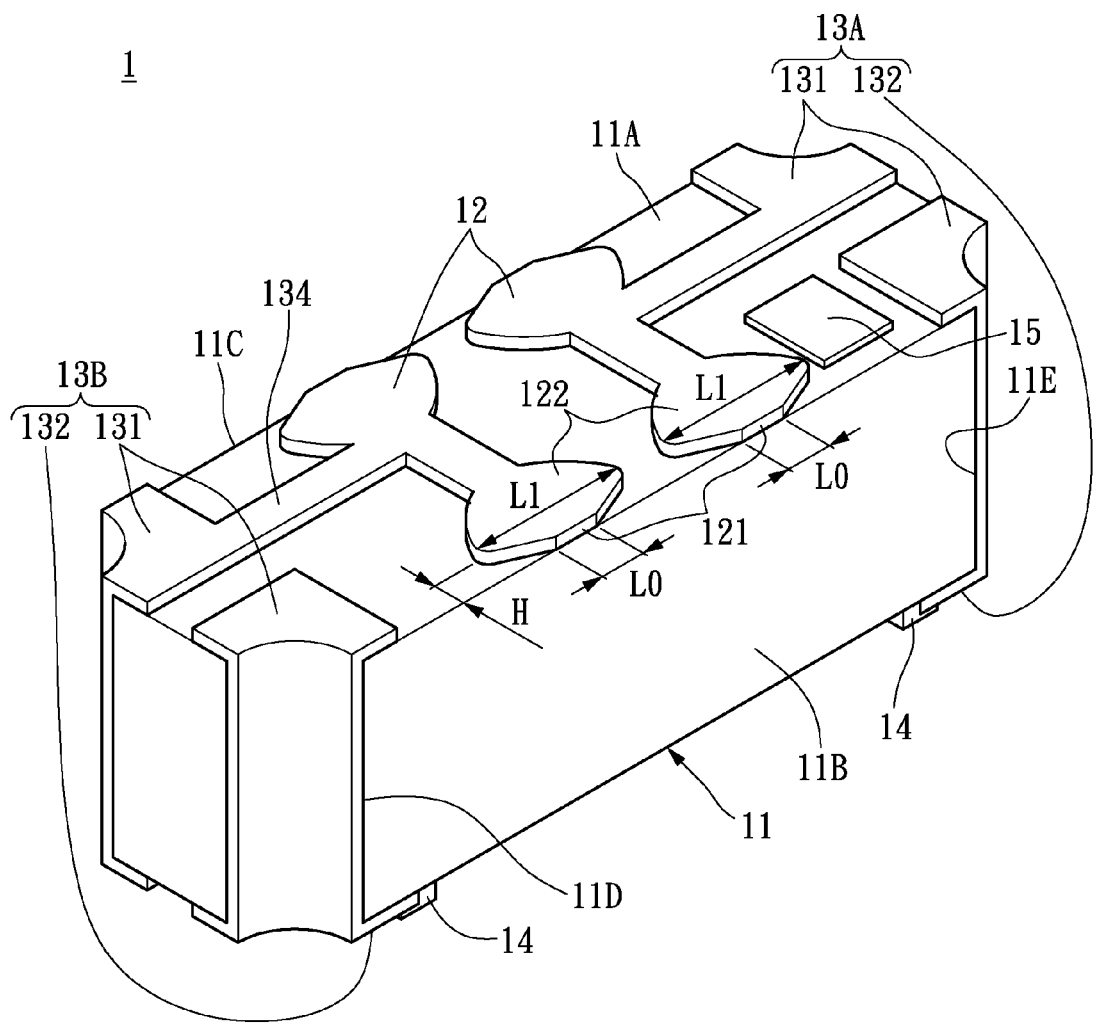
FIG. 7 shows a three-chip LED unit having the LED substrate structure of the instant disclosure.

In a preferred embedment for a single-chip LED unit, the longest length of the transverse segment (i.e., L1) formed on the expansion region 122 parallel to the first cutting segment 121 preferably ranges from one third (⅓) to one quarter (¼) of the length of the first side 111 or 112 (i.e., the long sides) of the bottom surface 11A. In addition, the length of the first cutting segment 121 (i.e., L0) preferably ranges from one half (½) to one third (⅓) of the longest length of the segment (i.e., L1) defined on the expansion region 122 parallel to the first cutting segment 121. The above-mentioned length range may improve the soldering ability of the LED substrate structure 1. For a two-chip LED unit as shown in FIG. 6, only one conducting portion 12 is required, just as the single-chip setup. Thus, similarly, the longest transverse segment (i.e., L1) formed on the expansion region 122 parallel to the first cutting segment 121 preferably ranges from one third (⅓) to one quarter (¼) of the length of the first side 111 or 112 (i.e., the long sides) of the bottom surface 11A. The length of the first cutting segment 121 (i.e., L0) preferably ranges from one half (½) to one third (⅓) of the longest length of the segment (i.e., L1) formed on the expansion region 122 parallel to the first cutting segment 121. For a three-chip LED unit as shown in FIG. 7, where two conducting portions 12 are required, the longest transverse segment (i.e., L1) formed on the expansion region 122 parallel to the first cutting segment 121 preferably ranges from one quarter (¼) to one fifth (⅕) of the length of the first side 111 or 112 (i.e., the long sides) of the bottom surface 11A. The length of the first cutting segment 121 (i.e., L0) preferably ranges from one half (½) to one third (⅓) of the longest length of the segment (i.e., L1) formed on the expansion region 122 parallel to the first cutting segment 121.

Accordingly, the longest transverse segment (i.e., L1) of the expansion region 122 may preferably range from one third (⅓) to one fifth (⅕) of the length of the first long side 111/112 of the bottom surface 11A. Moreover, the distance "H" between the longest transverse segment (i.e., L1) and the first cutting segment 121 shall be arranged in accordance to the type of soldering material chosen. Specifically, the slope of the first and the second obliquely extending side edges 124A, 124B should be correspondingly arranged depending on the viscosity/adherent properties of the selected soldering material, so that the soldering material may establish best contact with the first and the second side edges 124A, 124B and provide a better soldering ability. Preferably, the distance "H" is arranged between 0.12 mm to 0.20 mm inclusively or substantially greater than or equal to the thickness of the soldering material screen-printed on the PCB.

Please refer FIGS. 1A, 1B, and FIG. 2, the present LED substrate structure 1 further has two electrodes 13A, 13B. The electrode 13A is formed on the bottom surface 11A, the second lateral surface 11E and the mounting surface 11F. Similarly, the electrode 13B is formed on the bottom surface 11A, the second lateral surface 11D and the mounting surface 11F. In other words, the electrodes 13A, 13B are U-shaped and are symmetrically arranged at the two distal (long) ends of the LED substrate structure 1.

Figure 3B:
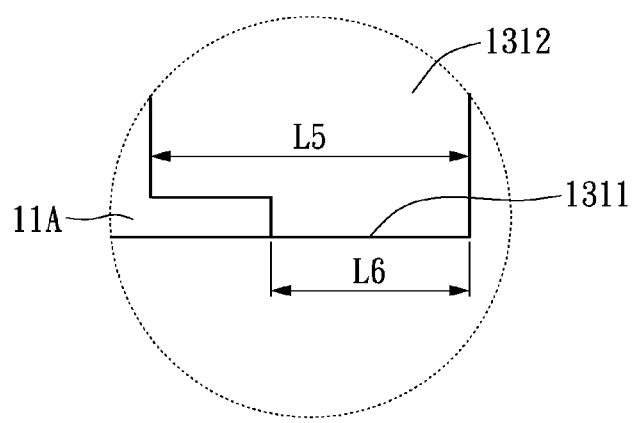
FIG. 3B is an enlarged view of "B" part in FIG. 2.

Each of the electrodes 13A and 13B has a side conducting portion 131 respectively formed on the opposing transverse ends of the bottom surface 11A. Each side conducting portion 131 is formed between the long sides of the LED substrate structure 1 (i.e., between the first contact border defined between the first lateral surface 11B and the bottom surface 11A and the second contact border defined between the first lateral surface 11C and the bottom surface 11A). Please refer back to FIGS. 2 and 3B and focus on the electrodes 13A, 13B that are respectively arranged at the two distal (longitudinal) ends of the LED substrate structure 1. Each side conducting portion 131 has a second cutting segment 1311 formed on the first contact border defined between the first lateral surface 11B and the bottom surface 11A. For the ease of illustration, the width of the electrode 13A/13B at different sections thereof are respectively designated by a corresponding segment length (for example, L5, L6, etc.). For one thing, in the instant exemplary embodiment, the central portion of the electrode 13A/13B proximate the longitudinal axis X defines a main portion 1312, whose width is designated by the length L5. Moreover, in a similar fashion, to reduce the adverse effect of burrs resulting from the singulation process, it is preferable for the length of the second cutting segment 1311 (i.e., L6) to be smaller than the length of the main portion 1312 (i.e., L5). In the exemplary embodiment, a stair-shaped structure is implemented between the second cutting segment 1311 and the main portion 1312, though the exact arrangement of the burr-reducing structure should not be strictly restricted to the example provided herein. By implementing similar design features as the first cutting segment 121 to the electrodes 131, the length or width of the second cutting segment 1311 can be shortened so that the "burring" issue may be reduced. Thus, the soldering material can better adhere and "climbs up" onto the side conducting portion 131, thus providing better soldering ability. With regard to the two-chip LED unit shown in FIG. 6, a conduction arm 134 is formed between the conducting portion 12 and the side conducting portion 131. Still further, with regard to the three-chip LED unit shown in FIG. 7, the two side conducting portions 131 respectively have a conduction arm 134 to connect to the conducting portion 12.

Each of the electrodes 13A, 13B has a connection portion 132 and a functional portion 133 arranged on the mounting surface 11F. The functional portion 133, which extends from the connection portion 132, includes at least one curvilinear structure. In the exemplary embodiment, the functional portion 133 of the electrode 13B, which includes a curvilinear structure that consists of two bent portions, may be provided as a die-mounting portion for mounting a LED chip (i.e., a light emitting component 2 shown in FIGS. 8A and 8B). On the other hand, the functional portion 133 of the electrode 13A, which includes a curvilinear structure that consists of a single bent portion, may be provided as a wire-bonding portion to accept a bonding wire for the purpose of establishing electrical connection. It is preferable for the functional portion 133 (either the die-mounting portion, the wire-bonding portion, or both) to have at least one curvilinear structure to provide a longer and tortuous path that serves to prevent moisture from entering into the functional portion 133 easily.

Figure 8A:
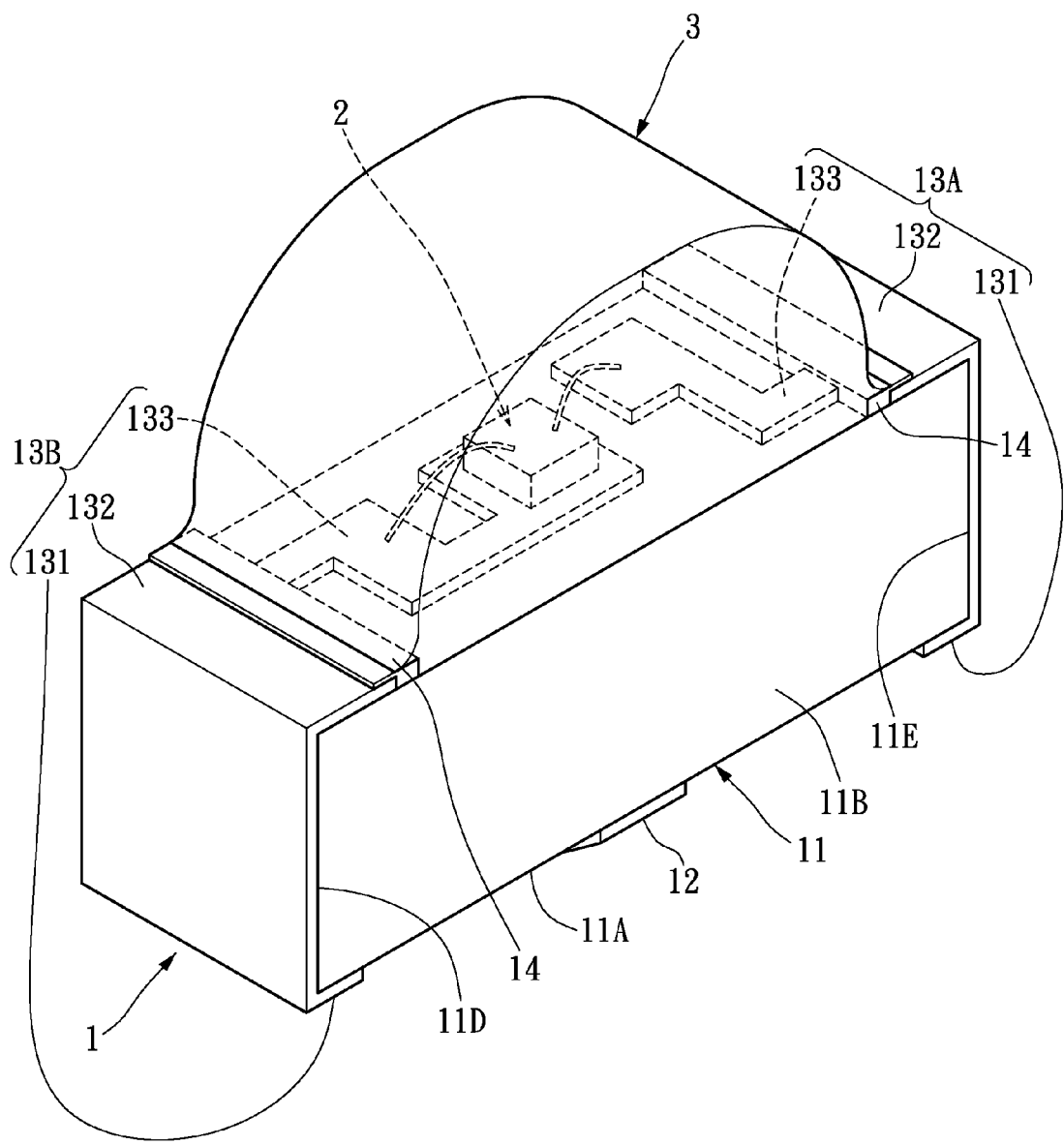
FIG. 8A shows a perspective view of the LED unit of the instant disclosure.
Figure 8B:
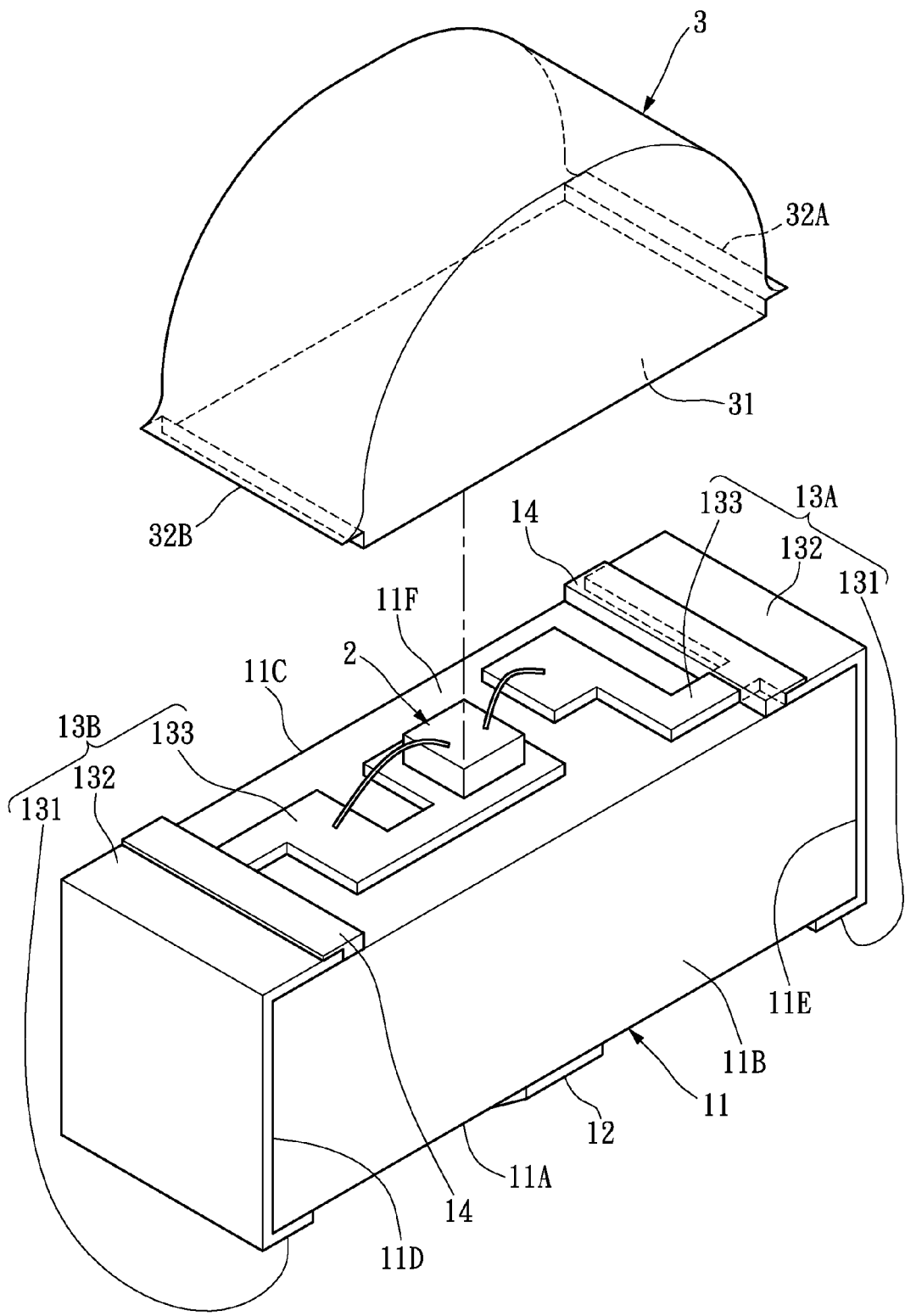
FIG. 8B shows an exploded view of the LED unit of the instant disclosure.

Please refer to FIGS. 8A and 8B for the illustration of the deposition of packaging member 3. The light emitting component 2 is first mounted electrically on the functional portion 133, and a packaging member 3 is coveringly disposed to encapsulate the light emitting component 2. To aid the molding of the packaging member 3 and achieve more precise alignment thereof with respect to the LED substrate structure 1, two imaginary press-molding lines may be respectively defined between the connection portion 132 and the functional portion 133 on each of the electrodes 13A, 13B in correspondence to the length of the packaging member 3. In other words, when a mold is used to dispose a package material onto the LED substrate structure 1 to form the packaging member 3, press-molding lines defined on the electrodes 132A, 132B in correspondence to the opposite ends of the packaging member 3 may provide more precise alignment thereof with respect to the LED substrate 1. Preferably, an interface layer 14 is coveringly disposed on the press-molding line to structurally define this imaginary boundary. For instance, the interface layer 14 is coveringly disposed between the connection portion 132 and the functional portion 133 over the substrate 11. Specifically, the interface layer 14 may be made of a coating of solder mask (solder resisting) material. As shown in the instant exemplary embodiment (in FIG. 8B), the interface layer 14 partially covers the electrodes 13A, 13B (e.g., the connection portion 132 and the functional portion 133) and partially covers the mounting surface 11F of the substrate 11. Referring again to FIG. 8B. In the instant embodiment, the packaging member 3 is designated to be a package contact surface 31 that will establish contact with the mounting surface 11F of the substrate 11 upon assembly, with flanges 32A, 32B thereof located on the interface layer 14. Because that the interface layer 14 and the packaging member 3 have similar properties (e.g. the interface layer 14 is made of solder mask material containing various resins and packaging member 3 is made of epoxy), an improved coupling strength may be obtained between the interface layer 14 and the packaging member 3. Furthermore, the package material may be prevented from leaking through the interface between the interface layer 14 and the packaging member 3. Similarly, the soldering material may be prevented from entering the packaging member 3 through the interface between the interface layer 14 and the packaging member 3. In an alternative embodiment, the position of the press-molding line corresponding to the packaging member 3 may be defined on the connection portion 132, or may be defined on the functional portion 133 and mounting surface 11F instead. However, the press-molding line is still covered by the interface layer 14.

The above-mentioned LED substrate structure 1 may be applied to a LED unit. Accordingly, the instant disclosure also provides a LED unit that utilizes an above-mentioned LED substrate structure 1, a light emitting component 2 mounted on the LED substrate structure 1, and a packaging member 3 covering the light emitting component 2. The structural detail of the LED substrate structure 1 can be referenced to the above-mentioned description. The light emitting component 2 may be an LED disposed on the mounting surface 11F and electrically connected to the electrodes 13A, 13B. For example, the light emitting component 2 is mounted on the functional portion 133 of the electrode 13B and is wire-bonded onto the functional portion 133 of electrode 13A. The packaging member 3 is formed on the mounting surface 11F and covers the light emitting component 2. As shown in FIGS. 8A and 8B, the packaging member 3 may be a semi-cylindrical cover having a package contact surface 31 contacting the mounting surface 11F. The package contact surface 31 has two opposite flanges 32A, 32B locating on the interface layer 14 of the LED substrate structure 1. Since the interface layer 14 and the packaging member 3 have similar material properties, the interface layer 14 and the packaging member 3 may exhibit improved bonding strength therebetween. Thus, the package material may be prevented from leaking therethrough. Moreover, the LED substrate structure 1 may have an identification portion 15 as shown in FIGS. 6 and 7, e.g. which is preferably formed on the bottom surface 11A of the substrate 11 with desired color or shape for identification purposes (such as markings for polarity, install position, or other labeling purposes). In the exemplary embodiment, the identification portion 15 is formed by disposing solder mask material on the bottom surface 11A.

Figure 9A:
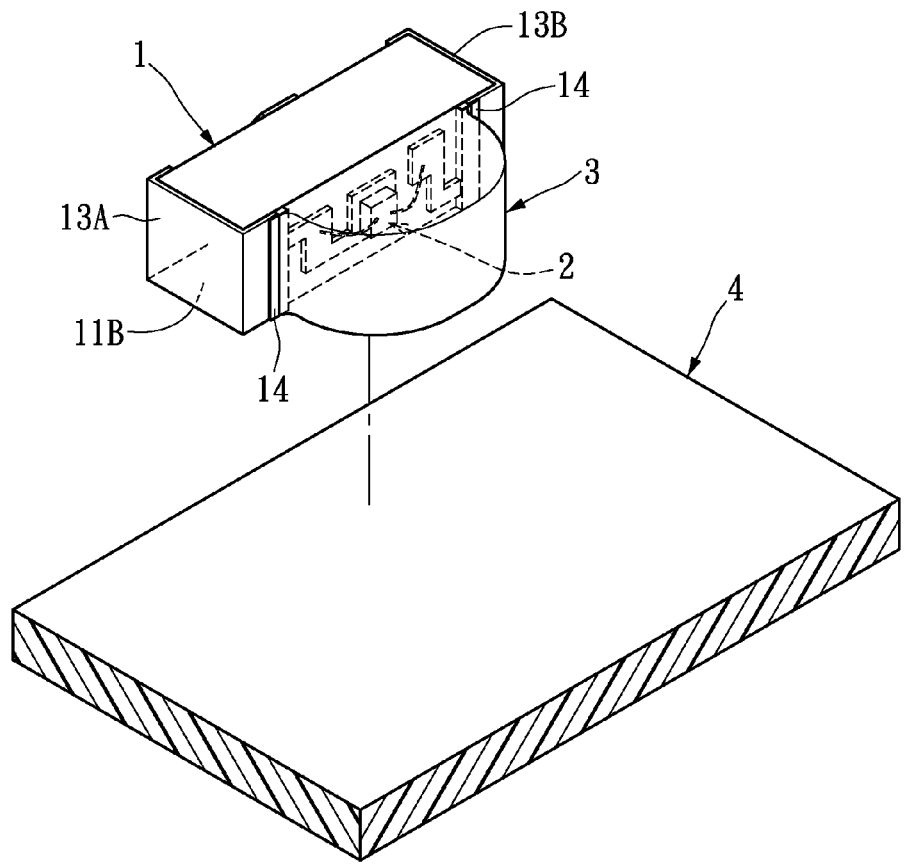
FIG. 9A shows an exploded view of the lighting module of the instant disclosure.
Figure 9B:
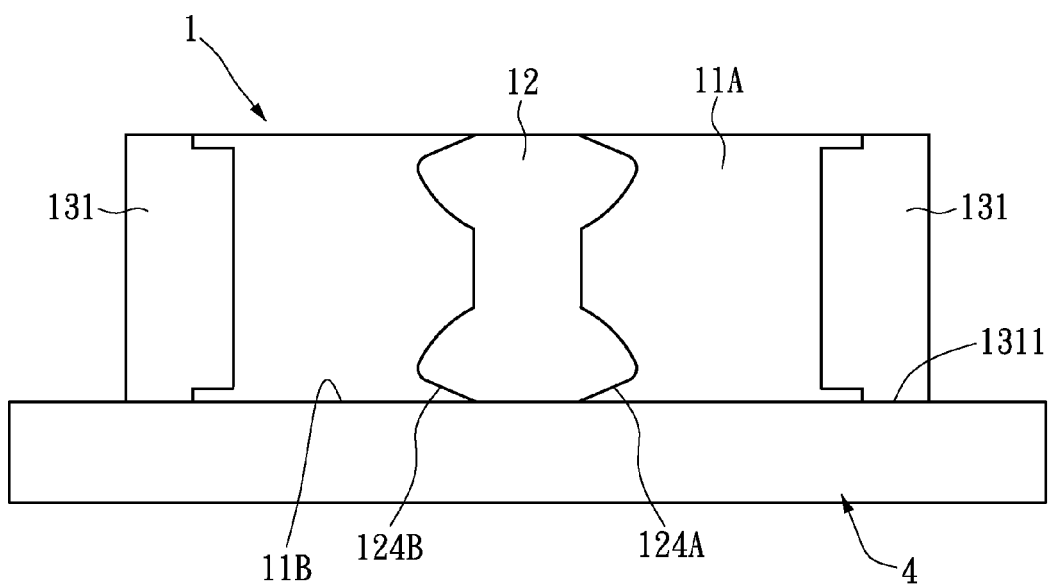
FIG. 9B shows a side view of the lighting module of the instant disclosure.

The above-mentioned LED unit may be applied to a lighting module. Please refer to FIGS. 9A and 9B, which shown a lighting module that utilizes a LED unit in accordance with the instant disclosure. The present lighting module includes the carrier board 4 (such as a PCB), a LED substrate structure 1 as disclosed above, a light emitting component 2 mounted on the LED substrate structure 1, and a packaging member 3 covering the light emitting component 2. In the exemplary embodiment, the first lateral surface 11B is defined as a substrate contact surface that establishes contact with the carrier board 4 upon assembly. As previously discussed, the conducting portion 12, which extends from the contact border defined between the substrate contact surface (i.e., the first lateral surface 11B) and the bottom surface 11A, includes the first cutting segment 121, the expansion region 122, and the main region 123, sequentially. In a thermal reflow process, the soldering material deposited on the carrier board 4 may adhere to (and "climb up" onto) the conducting portion 12 through the circular sector-shaped expansion region 122 of the conducting portion 12, especially through the first and the second side edges 124A, 124B thereof. Similarly, the soldering material deposited on the carrier board 4 may also adhere to and "climb up" onto the two side conducting portions 131 through the second cutting segment 1311. Therefore, the soldering material can achieve better coupling strength with the conducting portion 12 and the side conducting portion 131, thereby more stably fixing the LED substrate structure 1 onto the carrier board 4.

On the other hand, because of the side-mounting style implemented by the instant disclosure where the first lateral surface 11B is designed to establish contact with the carrier board 4, the position of the electrodes 13A, 13B may be provided in immediate proximity of the carrier board 4. In a thermal reflow process, the soldering material deposited on the carrier board 4 may more effectively adhere to and "climb up" onto the electrodes 13A, 13B and move along the electrodes 13A, 13B. To prevent the soldering material from entering into the packaging member 3, the interface layer 14 is applied on the border between the connecting portion 132 and the functional portion 133 of the electrodes 13A/B, the solder mask material applied thereon may help to improve the coupling strength between the packaging member 3 and the interface layer 14. Thus, the issue of the soldering material penetrating into the functional portion 133 may be reduced. In other words, improved coupling strength may be obtained between the interface layer 14 and the packaging member 3, so that the package material is prevented from leakage through the interface between the interface layer 14 and the packaging member 3. Similarly, the soldering material may be prevented from entering the packaging member 3 along the electrodes 13A, 13B.

The present disclosure offers at least the following advantages:

Firstly, the present disclosure can improve the connection between the soldering material and the conducting portion, as well as between the soldering material and the side conducting portions, by reducing the length of the cutting segment (e.g., the first and the second cutting segments). In addition, the "burr-free" segments (e.g., the first and the second sides of the expansion region) beneficially provide decreased climbing resistance for the soldering material. Especially in the low-temperature soldering process, the present disclosure can improve the connection between the soldering material and the metal traces. Comparing the experimental results based on the present disclosure and the traditional structure in two hundred repetitive tests, the present disclosure exhibits good soldering ability of 100% under a 238° C. soldering process. On the contrary, the traditional structure suffers a failure rate of about 3% under the same processing conditions.

Secondly, the functional portion has at least one bent portion and the bent portion provides a longer and tortuous moisture-entering passage so that the moisture cannot easily enter into the packaging member.

In addition, the interface layer is formed on and between the connection portion and the functional portion of the electrodes so that the molded packaging member may establish more effective coupling contact with the interface layer. The connection strength of the packaging member and the interface layer may therefore be greater than that of the packaging member and traditional metal lead. Moreover, the package material may be prevented from leakage through the interface between the interface layer and the packaging member. Similarly, the soldering material is prevented from entering the packaging member along the electrodes.

The description above only illustrates specific embodiments and examples of the present invention. The present disclosure should therefore cover various modifications and variations made to the herein-described structure and operations of the present invention, provided they fall within the scope of the present disclosure as defined in the following appended claims. cm What is claimed is:

What is claimed is:
1. A lighting module, comprising:
a carrier board (4);
an insulating substrate (11) disposed on the carrier board, having a bottom surface (11A), a mounting surface (11F) opposite to the bottom surface, and two opposing first lateral surfaces (11B/C) connected between the bottom surface and the mounting surface,
wherein one of the two first lateral surfaces is defined as a substrate contact surface for establishing contact with the carrier board;
a conducting portion (12) disposed on a central region of the bottom surface (11A) of the substrate (11) traversing across the lateral surfaces (11B/C) thereof,
wherein the conducting portion (12) comprises at least one expansion region (122) adjacent to the substrate contact surface and has a first cutting segment (121) formed at a contact border defined between the substrate contact surface and the bottom surface,
wherein the width of the first cutting segment is shorter than any segment taken on the expansion region parallel thereto;
at least one light emitting component (2) disposed on the mounting surface (11F); and
a packaging member (3) covering the light emitting component.
2. The lighting module as claimed in claim 1, wherein the bottom surface has two opposite first sides and two opposite second sides, the two first lateral surfaces are respectively connected to the two first sides, and the substrate further has two opposite second lateral surfaces respectively connected to the two second sides.
3. The lighting module as claimed in claim 2,
wherein the substrate further has two electrodes (13A/B), each of the electrodes traverses across the bottom surface, the second lateral surface, and the mounting surface,
wherein the light emitting component is electrically connected to the electrodes, and the packaging member has an package contact surface to contact the mounting surface.
4. The lighting module as claimed in claim 3, further comprising an interface layer (14) partially covering the electrode and the mounting surface of the substrate, wherein each of the electrodes has a connection portion and a functional portion formed on the mounting surface, the interface layer is disposed between the connection portion and the functional portion, and a flange of the package contact surface of the packaging member is located on the interface layer.
5. The lighting module as claimed in claim 3, wherein each of the two electrodes has a side conducting portion formed on the bottom surface, the side conducting portion has a second cutting segment located on the contact border defined between one of the two first lateral surfaces and the bottom surface, the side conducting portion has a main portion connected with the second cutting segment, and a length of one parallel segment with the second cutting segment on the main portion is longer than the length of the second cutting segment.
6. An LED package unit, comprising:
an insulating substrate (11) for disposing on a carrier board, having a bottom surface (11A), a mounting surface (11F) opposite to the bottom surface, and two opposing first lateral surfaces (11B/C) connected between the bottom surface and the mounting surface,
wherein one of the two first lateral surfaces is defined as a substrate contact surface for establishing contact with the carrier board;
a conducting portion (12) disposed on a central region of the bottom surface (11A) of the substrate (11) traversing across the lateral surfaces (11B/C) thereof,
wherein the conducting portion (12) comprises at least one expansion region (122) adjacent to the substrate contact surface and has a first cutting segment (121) formed at a contact border defined between the substrate contact surface and the bottom surface,
wherein the width of the first cutting segment is shorter than any segment taken on the expansion region parallel thereto;
at least one light emitting component (2) disposed on the mounting surface (11F); and
a packaging member (3) covering the light emitting component.
7. The LED unit as claimed in claim 6, wherein the bottom surface has two opposite first sides and two opposite second sides, the two first lateral surfaces are respectively connected to the two first sides, and the substrate further has two opposite second lateral surfaces respectively connected to the two second sides.
8. The LED unit as claimed in claim 7, further comprising two electrodes, each of the electrodes traverse across the bottom surface of the substrate, the second lateral surface and the mounting surface, the light emitting component is electrically connected to the electrodes, and the packaging member has an package contact surface to contact the mounting surface.
9. The LED unit as claimed in claim 8, further comprising an interface layer partially covering the electrode and the mounting surface, wherein each of the electrodes has a connection portion and a functional portion formed on the mounting surface, the interface layer is disposed between the connection portion and the functional portion, and a flange of the package contact surface of the packaging member is located on the interface layer.

10. The LED unit as claimed in claim 9, wherein the functional portion is extended from the connection portion, the functional portion has at least one bent portion, the light emitting component disposed on the bent portion.

11. The LED unit as claimed in claim 8, wherein each of the two electrodes has a side conducting portion on the bottom surface, the side conducting portion has a second cutting segment located on the contact border defined between one of the two first lateral surfaces and the bottom surface, the side conducting portion has a main portion connected to the second cutting segment, and a length of one parallel segment with the second cutting segment on the main portion is longer than the length of the second cutting segment.

12. An LED substrate structure comprising
an insulating substrate (11) for disposing on a carrier board, having a bottom surface (11A), a mounting surface (11F) opposite to the bottom surface, and two opposing first lateral surfaces (11B/C) connected between the bottom surface and the mounting surface, wherein one of the two first lateral surfaces is defined as a substrate contact surface for establishing contact with the carrier board;
a conducting portion (12) disposed on a central region of the bottom surface (11A) of the substrate (11) traversing across the lateral surfaces (11B/C) thereof,
wherein the conducting portion (12) comprises at least one expansion region (122) adjacent to the substrate contact surface and has a first cutting segment (121) formed at a contact border defined between the substrate contact surface and the bottom surface,
wherein the width of the first cutting segment is shorter than any segment taken on the expansion region parallel thereto.

13. The LED substrate structure as claimed in claim 12, wherein the bottom surface has two opposite first sides and two opposite second sides, the two first lateral surfaces are respectively connected to the two first sides.

14. The LED substrate structure as claimed in claim 13, further comprising two opposite second lateral surfaces respectively connected to two second sides and a mounting surface opposite to the bottom surface.

15. The LED substrate structure as claimed in claim 14, further comprising two electrodes, each of the electrodes traverses across the bottom surface, the second lateral surface and the mounting surface.

16. The LED substrate as claimed in claim 15, further comprising an interface layer partially covering the electrode and the mounting surface, wherein each of the electrodes has a connection portion and a functional portion formed on the mounting surface, and the interface layer is disposed between the connection portion and the functional portion.

17. The LED substrate structure as claimed in claim 15, wherein each of the electrodes has a connection portion and a functional portion formed on the mounting surface, the functional portion is extended from the connection portion, and the functional portion has at least one bent portion.

18. The LED substrate structure as claimed in claim 15, wherein each of the electrodes has a side conducting portion on the bottom surface, the side conducting portion has a second cutting segment located on the contact border defined between one of the two first lateral surfaces and the bottom surface, the side conducting portion has a main portion connected with the second cutting segment, and a length of one parallel segment with the second cutting segment on the main portion is longer than the length of the second cutting segment.

19. The LED substrate structure as claimed in claim 13, wherein the length of one parallel segment with the first cutting segment on the expansion region is ranged from one third to one fifth of the length of the first side, and the length of the first cutting segment ranges from one half to one third of the length of one parallel segment with the first cutting segment on the expansion region.

20. The LED substrate structure as claimed in claim 13, wherein the conducting portion has a main region in connection with the expansion region, and the length of a longest parallel segment with the first cutting segment on the expansion region is greater than or equal to a length of one parallel segment with the first cutting segment on the main region.

* * * * *